(12) United States Patent
Tjahjono et al.

(10) Patent No.: US 9,728,669 B2
(45) Date of Patent: Aug. 8, 2017

(54) SOLAR CELL AND METHOD OF MANUFACTURING THE SAME

(71) Applicant: SUNRISE GLOBAL SOLAR ENERGY CO., LTD., Yilan County (TW)

(72) Inventors: Budi Tjahjono, Yilan County (TW); Ming-Jui Yang, Yilan County (TW); Chuan-Wen Ting, Yilan County (TW); Yu-Ting Chiu, Taoyuan County (TW); Jen-Ting Tan, Taipei (TW); Wen Sheng Wu, Yilan County (TW); Kuo-Wei Shen, Yilan County (TW); Fang-Wei Hu, Yilan County (TW)

(73) Assignee: Sino-American Silicon Products Inc., Hsinchu (TW)

( * ) Notice: Subject to any disclaimer, the term of this patent is extended or adjusted under 35 U.S.C. 154(b) by 618 days.

(21) Appl. No.: 13/924,752

(22) Filed: Jun. 24, 2013

(65) Prior Publication Data

US 2014/0251421 A1    Sep. 11, 2014

(30) Foreign Application Priority Data

Mar. 6, 2013 (TW) .............................. 102107813 A (51) Int. Cl.
| | |
|---|---|
| H01L 31/00 | (2006.01) |
| H01L 31/18 | (2006.01) |
| H01L 31/0224 | (2006.01) |
| H01L 31/0216 | (2014.01) |

(52) U.S. Cl.
CPC .... *H01L 31/1804* (2013.01); *H01L 31/02167* (2013.01); *H01L 31/02168* (2013.01); *H01L 31/022425* (2013.01); *Y02E 10/547* (2013.01); *Y02P 70/521* (2015.11)

(58) Field of Classification Search
CPC .......... H01L 31/1804; H01L 31/02167; H01L 31/02168
See application file for complete search history.

(56) References Cited

U.S. PATENT DOCUMENTS 6,180,869 B1 *  1/2001  Meier ............... H01L 21/28512
136/256

OTHER PUBLICATIONS

Schmidt et al., Surface Passivation of High Efficiency Silicon Solar Cells by Atomic Layer Deposited AL2O3, Progress in PV: Research and Applications; 2008 16:461-466.*

* cited by examiner

*Primary Examiner* — Shannon Gardner
(74) *Attorney, Agent, or Firm* — Rosenberg, Klein & Lee (57) ABSTRACT

A method of manufacturing solar cell includes providing a semiconductor substrate. A coating layer is then formed on a plurality of sides. Subsequently, an anti-reflective layer is formed on the layer. Finally at least one first electrode and at least one second electrode are formed. The first and second electrodes respectively and electrically connect to the second conductive amorphous substrate and the semiconductor substrate. The potential induced degradation is greatly reduced.

20 Claims, 6 Drawing Sheets

SOLAR CELL AND METHOD OF MANUFACTURING THE SAME

BACKGROUND

1. Field of the Invention

The instant disclosure relates to a solar cell and method of manufacturing the same; in particular, to a solar cell for suppressing potential induced degradation and method of manufacturing the same.

2. Description of Related Art

The reserves of fossil fuel are ever reducing and the resulting pollution is a serious concern. Thus the reusable and green energy has gained more attention recently. The recent research suggests that solar module in the field shows signs of power output degradation (FF, Voc, Jsc drop and worsening of shunt resistance) after being used under humid environment under a large voltage bias for a period of time. The phenomenon is commonly known as potential induced degradation (PID).

PID is generally classified into three modes: the impact of active area on the surface of the semiconductor materials, the power degradation and polarization of the semiconductor contact surface, and electrolysis corrosion and conductive ions migration. In most cases, PID occurs from the edge of the solar cell. Therefore, to suppress PID occurrence on the solar cell and the module thereof is the primary concern to a person in the field.

SUMMARY OF THE INVENTION

The object of the instant disclosure is to provide a method for suppressing potential induced degradation on a solar cell and a method of manufacturing the same. A coating layer is laminated on a plurality of sides of a first conductive substrate to avoid PID occurrence on the solar cell. As a result, PID occurrence is minimized or completely eliminated and the quality of the solar cell is better maintained.

The instant disclosure provides a method of manufacturing a solar cell. Firstly, a semiconductor substrate structure is provided, including providing a semiconductor substrate, which has a first surface, a second surface and a plurality of sides, and a conductive layer is formed on the first surface. Secondly, a coating layer is formed on the plurality of sides. Then, an anti-reflective layer is formed on top of the conductive layer. At least one first electrode is formed on the first surface or the second surface. Subsequently, at least one second electrode is formed on the other surface. The first and second electrodes are electrically connected to the semiconductor substrate respectively.

The instant disclosure also provides a solar cell, including a semiconductor substrate structure, a coating layer, an anti-reflective layer, at least one first electrode and at least one second electrode. The semiconductor substrate includes a semiconductor substrate and a conductive layer. The semiconductor substrate has a first surface, a second surface and a plurality of sides. The conductive layer is formed on the first surface. The coating layer surrounds the plurality of sides. The anti-reflective layer is formed on top of the conductive layer. The first electrode is electrically connected to the conductive layer while the second electrode is electrically connected to the semiconductor substrate.

The coating layer surrounding the plurality of sides of the first conductive layer can effectively reduce or completely avoid PID occurrence.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are examples for the purpose of further explaining the scope of the instant disclosure. Other objectives and advantages related to the instant disclosure will be illustrated in the subsequent descriptions and appended drawings.

First Embodiment

Figure 1:
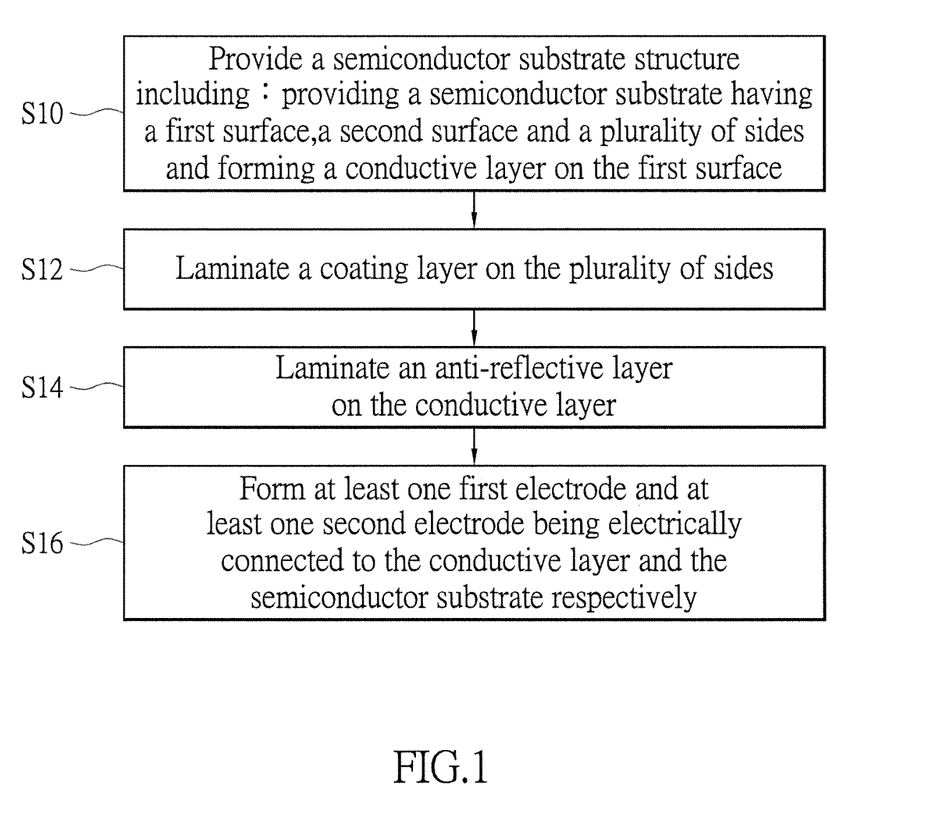
FIG. 1 is a flow chart of a first embodiment according to the instant disclosure.

Please refer to FIG. 1. According to a first embodiment of the instant disclosure, a method of manufacturing a solar cell is provided. The detailed description is elaborated herein.

Step S10. Please refer to FIG. 2. Firstly a semiconductor substrate is provided. The semiconductor substrate structure 1 includes a semiconductor substrate 10, which has a first surface 101, a second surface 102 and a plurality of sides 103. Please refer to FIG. 3. Subsequently, the semiconductor substrate 10 undergoes a texturing process to form a roughened layer 11b on the first surface 101. The dopants are incorporated in the layer 11b to form a conductive layer 11a.

Figure 2:
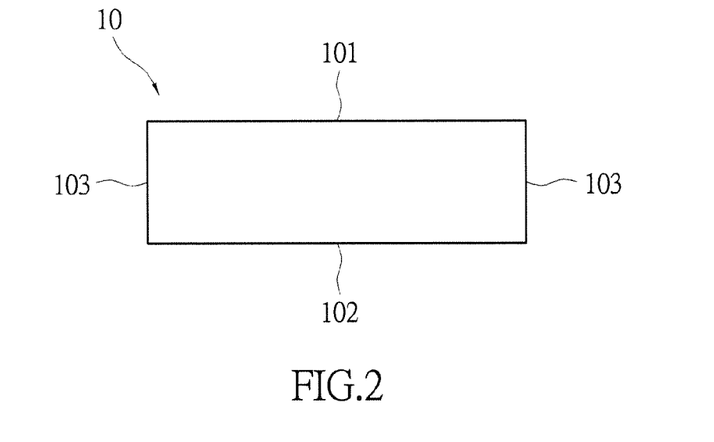
FIG. 2 is a schematic diagram of a semiconductor substrate structure of a first embodiment according to the instant disclosure.
Figure 3:
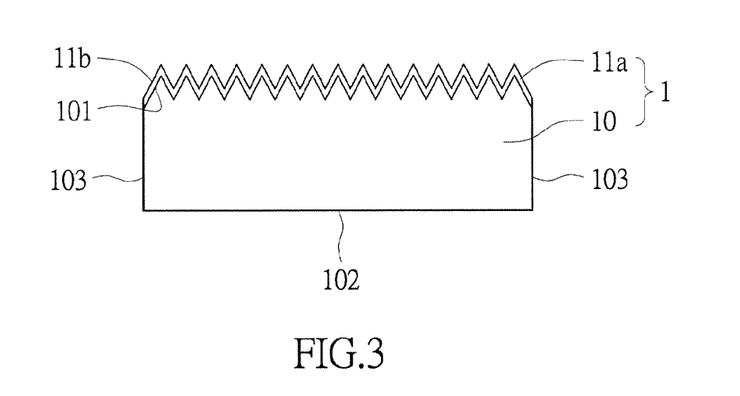
FIG. 3 is a schematic diagram of a semiconductor substrate structure of a first embodiment according to the instant disclosure.

In the instant embodiment, the plurality of sides 103 are defined by the first surface 101 and the second surface 102. The semiconductor substrate 10 can be a monocrystalline silicon substrate, polycrystalline silicon substrate or a mono-like silicon substrate. The thickness of the semiconductor substrate 10 ranges between 180 to 220 μm yet the instant disclosure is not limited thereto. The first surface 101 of the semiconductor substrate 10 may be a front surface whereas the second surface 102 of the same may be a rear surface.

In the instant embodiment, in the texturing process, acidic or alkali solution can be used to wash the first surface 101 of the semiconductor substrate 10 to form the roughened layer 11b. Etching process may also be used to achieve the same result. The various sized protrusion, substantially resembling pyramids, serves the job of reducing the occurrence of incident light reflection at the first incident. In other words, the roughened structure reduces the rate of sun light reflection.

Furthermore, the roughened layer 11b can be formed on the first surface 101 of the semiconductor substrate 10 alone or the first and second surfaces 101, 102 of the semiconductor substrate 10. In the instant embodiment, the roughened layer 11b is formed on the first surface 101 yet the instant disclosure is not limited thereto. In addition, the dopants are incorporated in the layer 11b to form the semiconductor layer of the second conductive amorphous substrate. The semiconductor layer acts as the emitter layer of the solar cell. The dopants may be boron, phosphorous or arsenic. The semiconductor substrate 10 is a p-type silicon substrate whereas the conductive layer 11a is an n-type silicon substrate. Similarly, the semiconductor substrate 10 may be an n-type silicon substrate whereas the second conductive amorphous substrate may be a p-type silicon substrate.

The dopants can be incorporated in to the roughened layer 11b of the semiconductor substrate 10 by furnace diffusion, screen printing, spin coating or spraying. As a result, the semiconductor substrate 10 is formed with the first conductive zone and a second conductive zone, for example, p-type conductive zone and n-type conductive zone. More specifically, the doping concentration of the p-type and n-type conductive zones may vary according to intended purpose. In the following description, the conductive layer is designated as 11a for clarity.

Moreover, a p-n junction is formed between the semiconductor substrate 10 and the conductive layer 11a. Due to the diffusion of electron and hole, a depletion region is defined proximate to the p-n junction. Also, the p-type and n-type conductive zones respectively carry negative and positive charges and define a space charge region superimposing the depletion region. Accordingly, when the sun light shines on the p-n substrate, the p-type and n-type zones absorb the sun light and pairs of electron and hole form and drawn to the depletion region. Subsequently, the electrons and holes drift in the space charge region.

Figure 4:
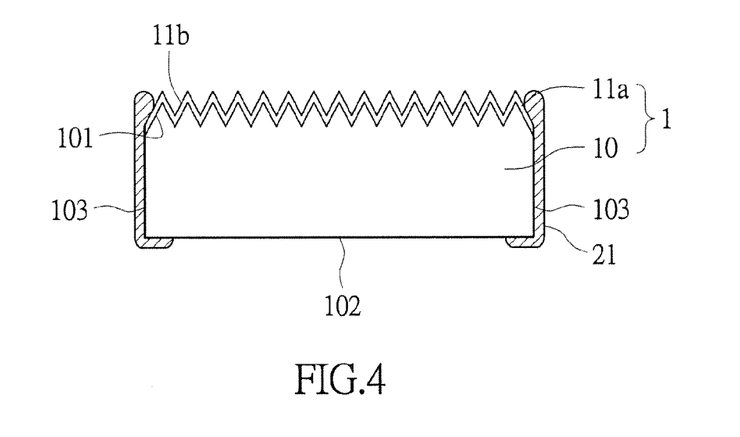
FIG. 4 is a schematic diagram showing a coating layer formed on a plurality of sides, edges of layer and edges of a second surface in accordance with a first embodiment of the instant disclosure.

Step S12. A coating layer 21 is formed on the plurality of sides 103. The coating layer 21 is formed on the plurality of sides 103 by plasma enhanced chemical vapor deposition (CVD), atmospheric pressure CVD (APCVD), atomic layer deposition (ALD) or physical vapor deposition (PVD).

It is worth noting that the coating layer 21 may be single-layered or multilayered. In addition, the coating layer 21 completely covers the plurality of sides 103. When the coating layer 21 is single-layered, the material of coating layer 21 is selected from the group consisting of aluminium oxide, titanium oxide, zirconium oxide, hafnia, metal oxides and the combination thereof. When the coating layer 21 is multilayered, a protection layer (not shown) is formed on the outer surface of the coating layer 21. The protection layer serves the job of preventing the coating layer 21 from being damaged by metals. The metal elements may come from the first and second electrodes 41, 42 and the conductive film 13. Accordingly, the potential induced degradation (PID) occurring to the edge and other area of the solar cell can be suppressed. The protection layer is made of silicon nitride, silicon oxynitride or the combination thereof. In the instant embodiment, the coating layer 21 is single-layered and the thickness ranges between 0.2 to 100 nm yet the instant disclosure is not limited thereto.

Please refer to FIG. 4. Upon laminating the coating layer 21 on the plurality of sides 103, the plasma enhanced CVD, APCVD, ALD or PVD may result in an extended portion of the coating layer 21 covering the edges of the layer 11b and second surface 102. The extended portion of the coating layer 21 may be measured between 0.1 to 100 mm lengthwise yet the instant disclosure is not limited thereto.

Figure 5:
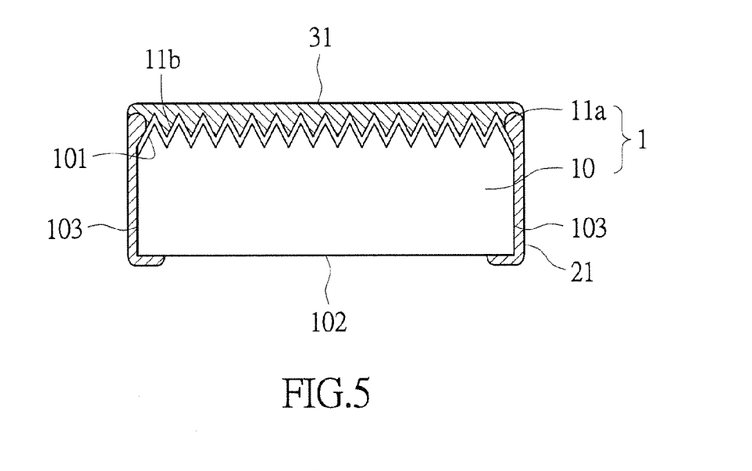
FIG. 5 is a schematic diagram showing an anti-reflective layer formed on a conductive layer in accordance with a first embodiment of the instant disclosure.

Step S14. Please refer to FIG. 5. An anti-reflective layer is deposited on the layer 11b and coating layer 21. The anti-reflective layer is formed by CVD or PVD. Specifically, the anti-reflective layer 31 also slows down the recombination speed of the carriers on the solar cell surface, enhances photoelectrical current, and protects the solar cell from scratching or moisture.

Step S16. At least one first electrode 41 and at least one second electrode 42 are respectively formed and electrically connected to the conductive layer 11a and the semiconductor substrate 10. The first and second electrodes 41, 42 may be formed respectively on the conductive layer 11a and the semiconductor substrate 10. Alternatively, the first and second electrodes 41, 42 may be formed on either the conductive layer 11a or the semiconductor substrate 10. Please refer to FIG. 6. In the instant embodiment, the first electrodes 41 are formed on the anti-reflective layer 31 and electrically connected to the conductive layer 11a. The second electrodes 42 are formed on the second surface 102 and electrically connected to the semiconductor substrate 10. However, the electrodes deposition in the instant embodiment does not intend to restrict the instant disclosure.

Figure 6:
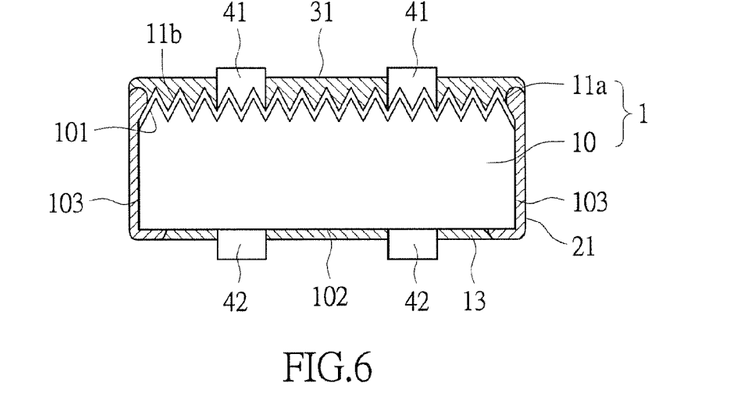
FIG. 6 is a schematic diagram showing a first electrode formed on an anti-reflective layer and a second electrode formed on a second surface in accordance with a first embodiment of the instant disclosure.

Step 16 further includes forming a conductive material on the anti-reflection layer 31. The conductive material formation is followed by a high temperature sintering. At least one first electrode 41 is formed in the metallization. Each first electrode 41 is electrically connected to the conductive layer 11a through the anti-reflection layer 31. The conductive material is formed on the second surface 102. Subsequently, the high temperature sintering is conducted and at least one second electrode 42 is formed during the metallization. Each second electrode 42 is electrically connected to the semiconductor substrate 10. Then, the back electric field is formed on the second surface 102 of the conductive film 13 excluding the area of the second electrodes 42. However, the location of the electrode of the instant disclosure is not limited thereto.

Specifically, the conductive material on anti-reflection layer 31 and the second surface 102 can be formed by partial screen printing or spraying. Furthermore, the conductive material may be made of silver, aluminum or the alloy thereof. The high temperature sintering is conducted under 570° C. to 900° C. to remove the volatile solvent in the conductive material and to form electrical contacts. More specifically, during sintering, the conductive adhesive on the anti-reflective layer 31 and the second surface 102 is respectively electrically connected to the conductive layer 11a and the semiconductor substrate 10 because of altered molecular structure.

Subsequently, the conductive material substantially fills the area on the second surface 102 apart from the second electrodes 42. Then, the sintering allows the conductive material for metalizing to form a conductive film 13.

The sintering process is further divided into pre-sintering, sintering and cooling down to cure the first and second electrodes 41, 42 and the conductive film 13. Accordingly, the solar cell connects with external carriers by the first and second electrodes 41, 42 and therefore the electrons undergoing light and electricity conversion are transmitted to the exterior.

It is worth noting that even though in the instant embodiment the solar cell is a dual junction solar cell, the above-mentioned associated techniques can also be applied to back contact solar cell or the like.

Second Embodiment

The difference between the second and first embodiment lies in the step of forming the coating layer 21 on the plurality of sides 103 and the layer 11b. The step S10 is identical to the first embodiment and the same description is omitted herein. The difference between the first and second embodiment is elaborated hereafter.

Figure 7:
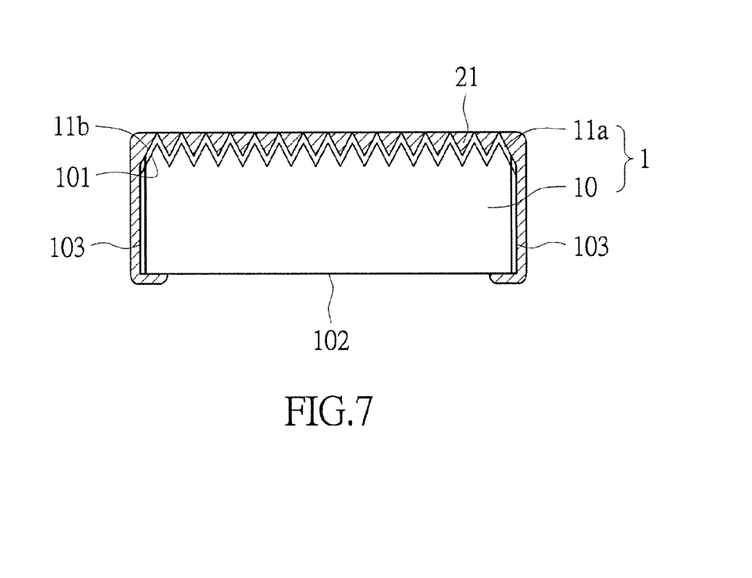
FIG. 7 is a schematic view showing a coating layer formed on a plurality of sides and a layer and the plurality of sides covering edges of a second surface in accordance with a second embodiment of the instant disclosure.

Specifically, the coating layer 21 completely covers the plurality of sides 103 and the conductive layer 11a while the first electrodes 41 are exposed. The coating layer 21 can be single-layered or multilayered. In the instant embodiment, the coating layer 21 is single-layered ranging between 0.2 to 100 nm. However, the thickness of the coating layer is not limited to the instant embodiment. Please refer to FIG. 7. Upon formation of the coating layer 21 on the plurality of sides 103 and layer 11b, a portion of the coating layer 21 stretches and covers the edge of the second surface 102 due to the processing.

Figure 8:
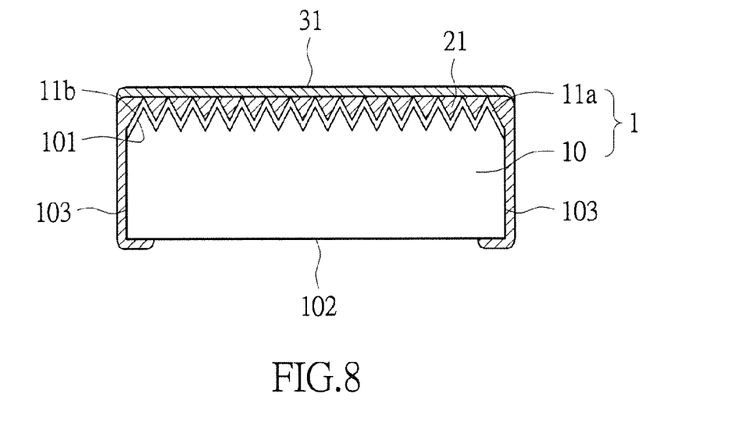
FIG. 8 is a schematic diagram showing an anti-reflective layer formed on a coating layer of a second conductive amorphous layer in accordance with a second embodiment of the instant disclosure.
Figure 9:
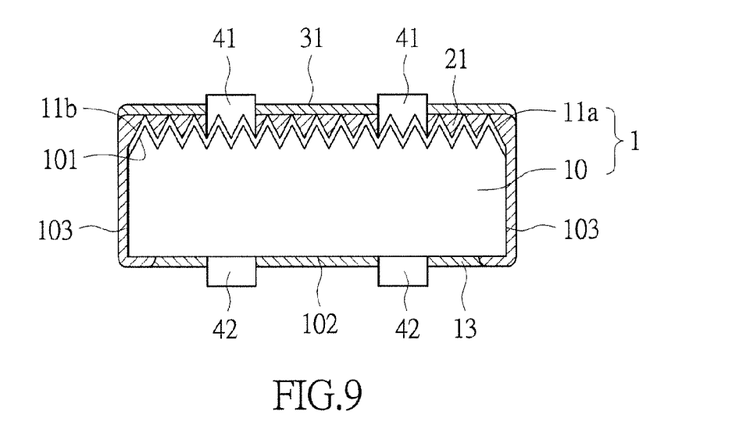
FIG. 9 is a schematic diagram showing a first electrode formed on an anti-reflective layer and a second electrode formed on a second surface in accordance with a second embodiment of the instant disclosure.

Please refer to FIG. 8. Then, the anti-reflective layer 31 is laminated on the coating layer 21 atop the layer 11b. Attention is now invited to FIG. 9. The first electrodes 41 are formed on the anti-reflective layer 31. The high temperature sintering is conducted to electrically connect the first electrodes 41 with the conductive layer 11a. Similarly, the second electrodes 42 are formed on the second surface 102. The sintering is conducted to electrically connect the second electrodes 42 with the semiconductor substrate 10. Finally, the conductive film 13 is formed on the second surface 102 as a back electric field while the second electrodes 42 are not covered by the conductive film 13. However, the electrode deposition of the instant disclosure is not limited to the instant embodiment.

Third Embodiment

The difference between the third and first embodiment lies in the formation of the coating layer 21 on the plurality of sides 103 of the semiconductor substrate 10 and the second surface 102. The step S10 is identical to the first embodiment and the same description is omitted herein. The difference is elaborated hereafter.

Figure 10:
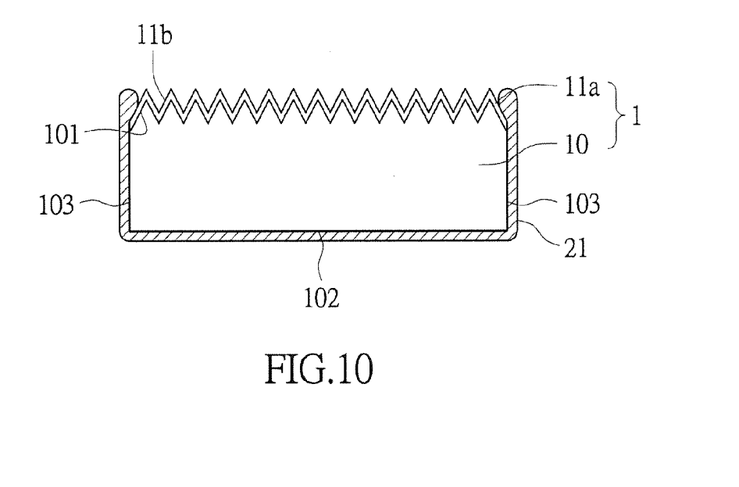
FIG. 10 is a schematic view showing a coating layer formed on a plurality of sides and a layer and the plurality of sides covering edges of a second surface in accordance with a third embodiment of the instant disclosure.

Specifically, the coating layer 21 completely covers the second surface 102 and the plurality of sides 103 while the second electrodes 42 are exposed. The coating layer 21 can be single-layered or multilayered. In the instant embodiment, the coating layer 21 is single-layered ranging between 02. to 100 nm. However, the thickness of the coating layer is not limited to the instant embodiment. Please refer to FIG. 10. Upon formation of the coating layer 21 on the plurality of sides 103 and second surface 102, a portion of the coating layer 21 stretches and covers the edge of the layer 11b due to the processing.

Figure 11:
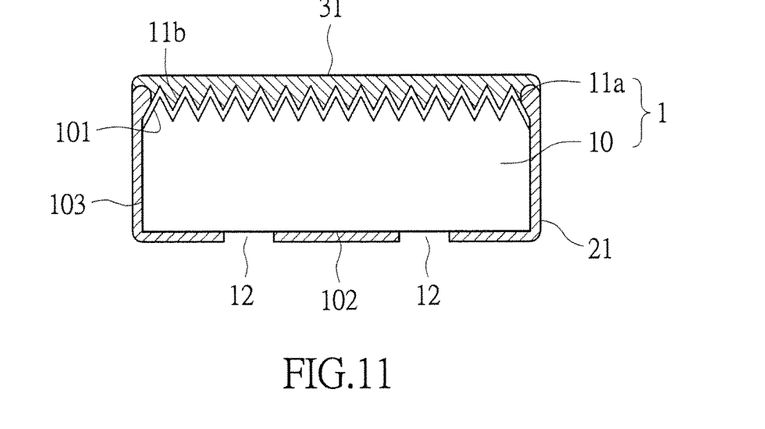
FIG. 11 is a schematic diagram showing a first opening formed on a coating layer of a second surface in accordance with a third embodiment of the instant disclosure.

Please refer to FIG. 11. The anti-reflective layer 31 is laminated on the layer 11b. Attention is now invited to FIG. 12. Subsequently, as step S16, the first electrodes 41 are disposed on the anti-reflective layer 31 and electrically connected to the conductive layer 11a. The second electrodes 42 are disposed on the second surface 102 and electrically connected to the semiconductor substrate 10. Finally, the conductive film 13 is laminated on the second surface 102 to form the back electric field while the second electrodes 42 are exposed. However, the deposition of electrodes of the instant disclosure is not limited to the instant embodiment.

Figure 12:
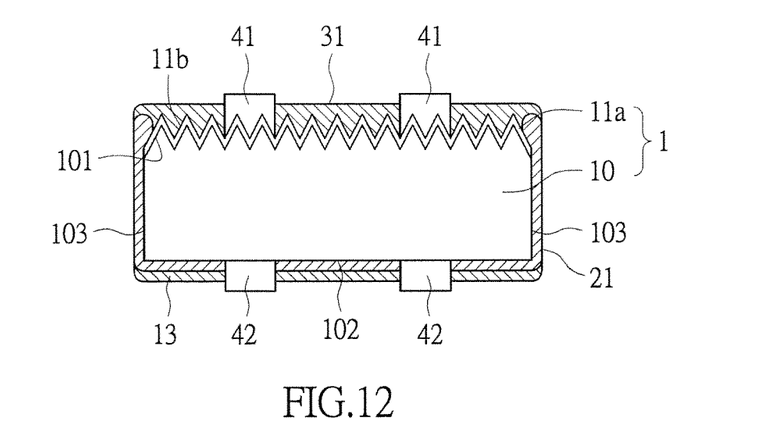
FIG. 12 is a schematic diagram showing a first electrode formed on an anti-reflective layer and a second electrode formed on a second surface in accordance with a third embodiment of the instant disclosure.

The step S16 further includes the formation of at least one first opening 12 on the coating layer 21 of the second surface 102. The first openings 12 partially expose the second surface 102 on the coating layer 21. The conductive material fills the openings 12 and after sintering, the conductive material is metalized. The conductive film 13 is then formed and contacts the semiconductor substrate 10. For example, the first openings 12 are formed on the metallization area on the coating layer 21 of the second surface 102. In other words, the openings 12 expose the area where the second electrodes 42 are to be disposed. Alternatively, the conductive material can be metalized by sintering without the formation of the first openings 12 on the coating layer 21. However, the formation of the openings is not restricted to the instant embodiment.

Specifically, the conductive material is formed on the anti-reflective layer 31 and followed by sintering. The first electrodes 41 are deposited on the anti-reflective layer 31 and electrically connected to the conductive layer 11a. Then, the conductive materials formed on the first openings 12 and followed by sintering to form the second electrodes 42 in the metallization. The conductive material fills most of the second surface 102 apart from the second electrodes 42. The sintering is then conducted to metalize the conductive material and form the conductive film 13. Each second electrode 42 electrically connects the semiconductor substrate 10 via the first openings 12. That is to say, in the instant embodiment, the first openings 12 allow the second electrodes 42 and the semiconductor substrate 10 for contacting.

In the instant embodiment, the first openings 12 expose where the second electrodes 42 are to be formed. The first openings 12 can be formed by laser or etching. The etching solution can be phosphoric acid, hydrofluoric acid or nitric acid. Furthermore, the first opening 12 can be round or linear and the instant disclosure is not limited thereto.

Fourth Embodiment

Figure 13:
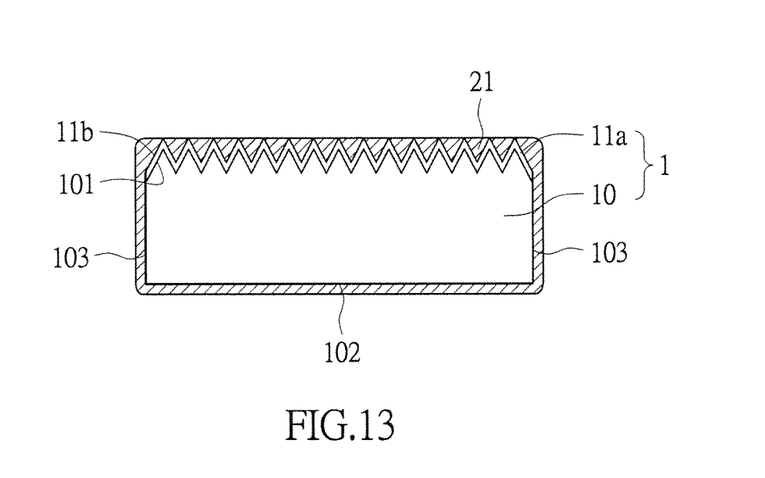
FIG. 13 is a schematic view showing a coating layer formed on a plurality of sides and a layer and the plurality of sides covering edges of a second surface in accordance with a fourth embodiment of the instant disclosure.

Please refer to FIG. 13. The difference between the fourth and third embodiment lies in the formation of the coating layer 21 on the plurality of sides 103, layer 11b and second surface 102 of the semiconductor substrate 10. The step S10 is identical to the third embodiment and the same description is omitted herein. The difference is elaborated hereafter.

Specifically, the coating layer 21 completely covers the plurality of sides 103, layer 11b and second surface 102 while the second electrode 42 and contact area thereof are exposed. The coating layer 21 can be single-layered or multilayered. In the instant embodiment, the coating layer 21 is single-layered ranging between 0.2 to 100 nm yet the instant disclosure is not limited thereto.

Figure 14:
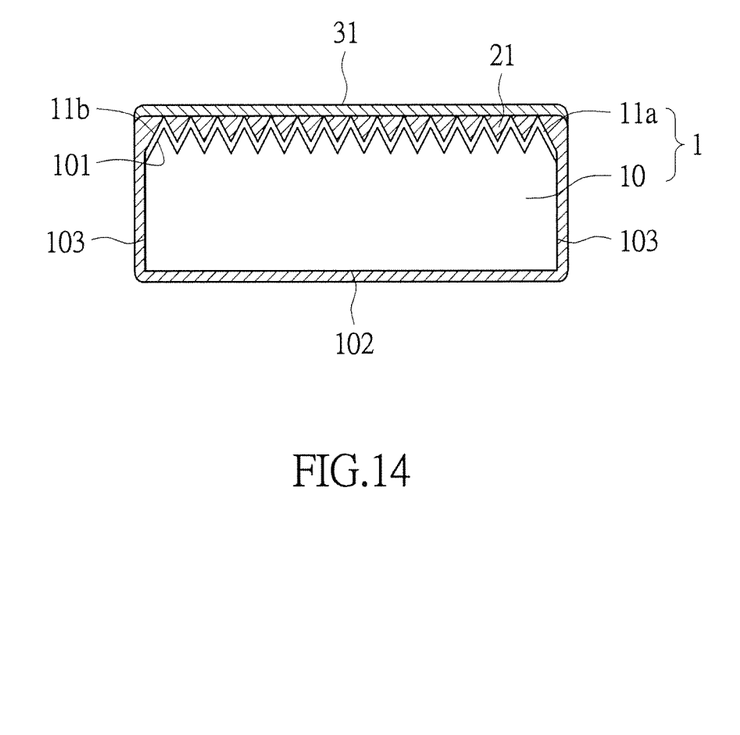
FIG. 14 is a schematic diagram showing an anti-reflective layer formed on a conductive layer in accordance with a fourth embodiment of the instant disclosure.
Figure 15:
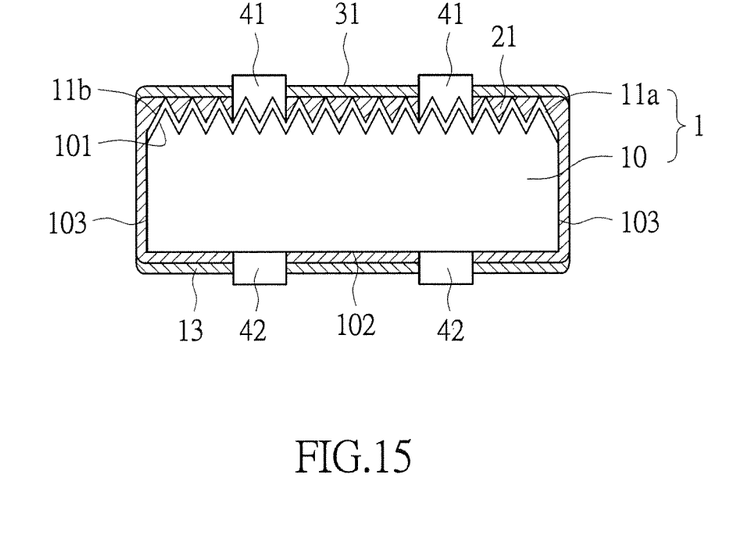
FIG. 15 is a schematic diagram showing a first electrode formed on an anti-reflective layer and a second electrode formed on a second surface in accordance with a fourth embodiment of the instant disclosure.

Please refer to FIG. 14. Subsequently, the anti-reflective layer 31 is laminated on the coating layer 21 of the layer 11b. Attention is now invited to FIG. 15. Per the abovementioned step S16, the first electrodes 41 are disposed on the anti-reflective layer 31 and electrically connected to the conductive layer 11a. Subsequently, the second electrodes 42 are disposed on the second surface 102 and electrically connected to the semiconductor substrate 10. Finally, the conductive film 13 is laminated on the second surface 102 while exposing the second electrodes 42 thereon to form a back electric field. However, the electrode deposition of the instant disclosure is not limited to the instant embodiment.

The instant disclosure provides the method of manufacturing the solar cell for suppressing PID. The PID is effectively reduced and the degradation rate is less than 5%. Furthermore, the coating layer is formed on the plurality of the sides of the semiconductor substrate and therefore the PID occurrence is greatly reduced and the quality of associated components is enhanced altogether.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A method of manufacturing photovoltaic cell comprising:
   providing a semiconductor substrate structure including:
      providing a semiconductor substrate having a first surface, a second surface and a plurality of sides; and
      forming a conductive layer on the first surface of the semiconductor substrate;
   laminating a separate and independent first coating layer formed of a metal oxide on each surface of the plurality of sides, wherein the first coating layer completely covers and surrounds the plurality of sides of the semiconductor substrate;
   forming a second coating protection layer covering the entire outer face of the first coating layer for protecting the first coating layer from metallic element damage, the second coating protection layer being selected from the group consisting of silicon nitride, silicon oxynitride and the combination thereof, the first coating layer and the second coating protection layer being formed of different compositions;
   laminating an anti-reflective layer on the conductive layer; and
   forming at least one first electrode and at least one second electrode being electrically connected to respectively the conductive layer and the semiconductor substrate.

2. The method according to claim 1, wherein the material of the first coating layer is selected from the group consisting of aluminium oxide, titanium oxide, zirconium oxide, hafnia and the combination thereof.

3. The method according to claim 1, wherein the semiconductor substrate is a polycrystalline silicon substrate, a monocrystalline silicon substrate or a mono-like silicon substrate.

4. The method according to claim 1, wherein the semiconductor substrate is a p-type silicon substrate while the conductive layer is an n-type emitter layer or the semiconductor substrate is an n-type silicon substrate while the conductive layer is a p-type emitter layer.

5. The method according to claim 1, wherein the thickness of the coating layer ranges between 0.2 to 100 nm.

6. The method according to claim 1 further comprising:
   laminating the first coating layer on the plurality of sides, the edges between the plurality of sides and the conductive layer and the edges between the plurality of sides and the second surface.

7. The method according to claim 1 further comprising:
   forming the first coating layer on the plurality of sides, the conductive layer and the edges between the plurality of sides and the second surface.

8. The method according to claim 1 further comprising:
   forming the first coating layer on the plurality of sides, the second surface and the edges between the plurality of sides/lateral surfaces and the conductive layer.

9. The method according to claim 1 further comprising:
   forming the first coating layer on the plurality of sides, the conductive layer and the second surface.

10. A solar cell comprising:
    a semiconductor substrate structure including:
       a semiconductor substrate having a first surface, a second surface and a plurality of sides; and
       a conductive layer formed on the first surface of the semiconductor substrate;
    a separate and independent first coating layer formed of a metal oxide and laminated on each surface of the plurality of sides, wherein the first coating layer completely covers and surrounds the plurality of sides of the semiconductor substrate;
    a second coating protection layer covering the entire outer face of the first coating layer for protecting the first coating layer from metallic element damage, the second coating protection layer being selected from the group consisting of silicon nitride, silicon oxynitride and the combination thereof, the first coating layer and the second coating protection layer being formed of different compositions;
    an anti-reflective layer laminated on the conductive layer;
    at least one first electrode electrically connected to the conductive layer; and
    at least one second electrode electrically connected to the semiconductor substrate.

11. The solar cell according to claim 10, wherein the material of first coating layer is selected from the group consisting of aluminium oxide, titanium oxide, zirconium oxide, hafnia and the combination thereof.

12. The solar cell according to claim 10, wherein the semiconductor substrate is a polycrystalline silicon substrate, a monocrystalline silicon substrate or a mono-like silicon substrate.

13. The solar cell according to claim 10, wherein the semiconductor substrate is a p-type silicon substrate while the conductive layer is an n-type emitter layer or the semiconductor substrate is an n-type silicon substrate while the conductive layer is a p-type emitter layer.

14. The solar cell according to claim 10, wherein the thickness of the coating layer ranges between 0.2 to 100 nm.

15. The solar cell according to claim 10, wherein the first coating layer is formed on the plurality of sides, the edge of the conductive layer and the edge of the second surface.

16. The solar cell according to claim 10, wherein the first coating layer is formed on the plurality of sides, the conductive layer and the edge of the second surface.

17. The solar cell according to claim 10, wherein the first coating layer is formed on the plurality of sides, the second surface and the edge of the conductive layer.

18. The solar cell according to claim 17, wherein the second surface includes a conductive film disposed thereon and the conductive film is formed with at least one opening exposing the semiconductor substrate.

19. The solar cell according to claim 10, wherein the first coating layer is formed on the plurality of sides, the conductive layer and the second surface.

20. The solar cell according to claim 19, wherein the second surface includes a conductive film disposed thereon and the conductive film is formed with at least one opening exposing the semiconductor substrate.

* * * * *